United States Patent
Tang et al.

(10) Patent No.: US 9,391,182 B2
(45) Date of Patent: Jul. 12, 2016

(54) TRENCH INSULATED-GATE BIPOLAR TRANSISTOR AND MANUFACTURE METHOD THEREOF

(71) Applicant: Wuxi China Resources Huajing Microelectronics Co., Ltd., Wuxi, Jiangsu (CN)

(72) Inventors: Hongxiang Tang, Jiangsu (CN); Yongsheng Sun, Jiangsu (CN); Jianxin Ji, Jiangsu (CN); Weiqing Ma, Jiangsu (CN)

(73) Assignee: WUXI CHINA RESOURCES HUAJING MICROELECTRONICS CO., LTD., Jiangsu (CN)

( * ) Notice: Subject to any disclaimer, the term of this patent is extended or adjusted under 35 U.S.C. 154(b) by 0 days.

(21) Appl. No.: 14/363,728

(22) PCT Filed: Dec. 3, 2012

(86) PCT No.: PCT/CN2012/085714
§ 371 (c)(1),
(2) Date: Jun. 6, 2014

(87) PCT Pub. No.: WO2013/083017
PCT Pub. Date: Jun. 13, 2013

(65) Prior Publication Data
US 2014/0346562 A1 Nov. 27, 2014

(30) Foreign Application Priority Data
Dec. 7, 2011 (CN) .......................... 2011 1 0402562

(51) Int. Cl.
*H01L 29/739* (2006.01)
*H01L 29/66* (2006.01)
*H01L 29/08* (2006.01)
*H01L 21/02* (2006.01)
*H01L 29/10* (2006.01)

(52) U.S. Cl.
CPC ...... *H01L 29/7397* (2013.01); *H01L 21/02499* (2013.01); *H01L 21/02634* (2013.01); *H01L29/0821* (2013.01); *H01L 29/0834* (2013.01); *H01L 29/1095* (2013.01); *H01L 29/66333* (2013.01); *H01L 29/66348* (2013.01); *H01L 29/7395* (2013.01)

(58) Field of Classification Search
CPC ................... H01L 29/66325; H01L 29/66333; H01L 29/6634; H01L 29/66348; H01L 29/7395; H01L 29/7396; H01L 29/7397
See application file for complete search history.

(56) References Cited

U.S. PATENT DOCUMENTS 5,331,184 A * 7/1994 Kuwahara ..................... 257/139
6,162,665 A * 12/2000 Zommer ....................... 438/133

(Continued)

FOREIGN PATENT DOCUMENTS

| CN | 1379479 A | 11/2002 |
|----|-----------|---------|
| JP | 2003-318399 A | 11/2003 |
| JP | 2010-129697 A | 6/2010 |

OTHER PUBLICATIONS

International Search Report for corresponding PCT application No. PCT/CN2012/085714.

*Primary Examiner* — Eric Ward
(74) *Attorney, Agent, or Firm* — Wood, Phillips, Katz, Clark & Mortimer

(57) ABSTRACT

A Trench Insulated Gate Bipolar Transistor (IGBT) and a manufacture method thereof are provided by the present invention, which belongs to the field of IGBT technical field. The manufacture method includes following steps: (1) preparing a semiconductor substrate; (2) forming an epitaxial layer grow on a first side of the semiconductor substrate by epitaxial growth; (3) preparing and forming a gate and an emitter of the Trench Insulated Gate Bipolar Transistor on a second side of the semiconductor substrate; (4) thinning the epitaxial layer to form a collector region; (5) metalizing the collector region to form a collector. The cost of the manufacture method is low and the performance of the Trench IGBT formed by the manufacture method is good.

9 Claims, 7 Drawing Sheets

(56) References Cited

U.S. PATENT DOCUMENTS

| | | | |
|---|---|---|---|
| 6,825,110 B2* | 11/2004 | Linder et al. | 438/627 |
| 6,949,439 B2* | 9/2005 | Flohrs et al. | 438/336 |
| 7,056,779 B2 | 6/2006 | Hattori | |
| 7,645,659 B2* | 1/2010 | Yun et al. | 438/202 |
| 2008/0083611 A1* | 4/2008 | Felmetsger | 204/192.15 |
| 2010/0193835 A1 | 8/2010 | Hshieh | |
| 2010/0327313 A1* | 12/2010 | Nakamura | 257/133 |
| 2011/0101416 A1* | 5/2011 | Schulze et al. | 257/139 |

* cited by examiner

TRENCH INSULATED-GATE BIPOLAR TRANSISTOR AND MANUFACTURE METHOD THEREOF

CROSS-REFERENCE TO RELATED APPLICATION

This application claims priority to a Chinese patent application No. 201110402562.5 filed on Dec. 7, 2011 and titled "Trench Insulated-Gate Bipolar Transistor And Manufacture Method Thereof", which is incorporated herein by reference in its entirety.

FIELD OF THE INVENTION

The present disclosure relates to the field of Insulated Gate Bipolar Transistor (IGBT) technologies, particularly to a manufacture method for a Trench IGBT and an IGBT manufactured by the manufacture method, and more particularly to a manufacture method for a Trench IGBT, in which front side processing is conducted substantially on a front side of a semiconductor substrate, and back side processing is conducted substantially in a epitaxial layer grown on a rear side of the semiconductor substrate.

BACKGROUND OF THE INVENTION

An IGBT, which is a common power device, is popular one among high-current switches, and is widely used for a case with a high voltage and high current, such as the case with an operation voltage of 1200V.

IGBTs include flat IGBTs and trench IGBTs depending on the structures of their gates, and structural features and respective characters of the flat IGBTs and trench IGBTs are well known by the skilled person in the prior art. A manufacture process for any of the flat IGBTs and the trench IGBTs includes the front side processing and the back side processing, where the front side processing is used to form a gate (referred to as G for short) and an emitter (referred to as E for short) of the IGBT, and the back side processing is used to form a collector (referred to as C for short) of the IGBT.

Generally, the existing Trench IGBT is manufactured by either of two methods below.

The first method includes: conducting the front side processing on a monocrystal silicon substrate, thinning the back side of the substrate, and performing ion injection on the back side of the substrate for several times to form a collector. This first method is independent of an epitaxy process, but is dependent on high-energy ion injection and annealing activation processes, thus the high cost of a high-energy ion injection device causes a high cost for implementing the high-energy ion injection process; further, the activation rate of the doped source in the collector region formed by the ion injection and annealing is low, leading to poor saturation feature of the IGBT.

The second method includes: forming a relatively thick epitaxial layer on a monocrystal silicon substrate by reverse epitaxial growth, conducting the front side processing on the epitaxial layer, and then thinning the silicon substrate at its back side to form a collector. Here, the epitaxial technology is employed in this second method and an IGBT is mainly manufactured at this epitaxial layer (that is, all layers above a buffer layer are formed by the epitaxial layer), thus the epitaxial layer is relatively thick and is required to have a very good performance (such as the number of defects). However, it often happens that bad quality of the epitaxial layer leads to bad performance (for example, bad endurance for overvoltage and overcurrent) or low yield of the IGBT.

In view of this, it is necessary to provide a new manufacture method for a Trench IGBT in order to promote the performance of the Trench IGBT.

SUMMARY OF THE INVENTION

In one aspect, the present invention improves the performance of a trench IGBT.

In another aspect, the present invention reduces the manufacture cost of a trench IGBT.

In order to achieve the above or other purposes, the following technical solutions of the present invention are provided.

According to an aspect of the present invention, a manufacture method for a trench IGBT is provided, which is characterized in comprising following steps:

preparing a semiconductor substrate;

forming an epitaxial layer on a first side of the semiconductor substrate by epitaxial growth;

forming a gate and an emitter of the trench Insulated Gate Bipolar Transistor on a second side of the semiconductor substrate;

thinning the epitaxial layer to form a collector region; and
metalizing in the collector region to form collector.

A manufacture method according to a preferable embodiment of the present invention, wherein the Trench Insulated Gate Bipolar Transistor is a Trench Field Stop Insulated Gate Bipolar Transistor; and the epitaxial growth comprises:

forming a first epitaxial layer on the first side of the semiconductor substrate by epitaxial growth, wherein the first epitaxial layer is used to form a buffer layer; and forming a second epitaxial layer on the first epitaxial layer by epitaxial growth, wherein the second epitaxial layer is used to form a collector region.

Preferably, in the manufacture method of the previous embodiment, wherein thinning the epitaxial layer comprises thinning the second epitaxial layer.

Preferably, in the manufacture method of the previous embodiment, wherein the semiconductor substrate is N-type doped, the first epitaxial layer is N-type doped and the second epitaxial layer is P-type doped.

Preferably, in the manufacture method of the previous embodiment, wherein a doping concentration of the semiconductor substrate ranges from $1\times10^9$ ions/cm$^3$ to $1\times10^{15}$ ions/cm$^3$.

Preferably, in the manufacture method of the previous embodiment, wherein a doping concentration of the first epitaxial layer ranges from $1\times10^{14}$ ions/cm$^3$ to $1\times10^{22}$ ions/cm$^3$, and the thickness of the first epitaxial layer ranges from 0.0001 micrometers to 100 micrometers.

Preferably, in the manufacture method of the previous embodiment, wherein a doping concentration of the second epitaxial layer ranges from $1\times10^{14}$ ions/cm$^3$ to $1\times10^{23}$ ions/cm$^3$, and the thickness of the second epitaxial layer ranges from 1 micrometer to 600 micrometers.

Preferably, in the manufacture method of the previous embodiment, wherein temperature for the epitaxial growth ranges from 1100° C. to 1240° C.

Preferably, in the manufacture method of the previous embodiment, wherein the collector has a composite stacked structure of Al/Ti/Ni/Ag; or a composite stacked structure of Ti/Ni/Ag or a composite stacked structure of Al/V/Ni/Ag.

Preferably, in the manufacture method of the previous embodiment, wherein before forming the epitaxial layer by epitaxial growth, the first side of the semiconductor substrate is polished.

According to an aspect of the present invention, a Trench Insulated Gate Bipolar Transistor is provided, which is manufactured by the manufacture method according to any previous manufacture method.

The technical effect of the present invention is described below. The collector is formed on the back side of the semiconductor substrate by epitaxial growth, so that the plurality of high-energy ion injection processes in the conventional technology are avoided, thus the present invention is relatively low in costs and is not limited by the high-energy ion injection device; furthermore, the front side processing for the trench IGBT is performed with the semiconductor substrate, and hence the quality of the semiconductor substrate is better than that of a semiconductor layer formed by epitaxial growth, thereby significantly improving the performance (such as the saturation character) of the Trench IGBT. The epitaxial semiconductor layer, which is mainly used to form a collector region, may have a low quality, so that the requirement for and costs of the epitaxial growth process are reduced. Therefore, the manufacture method of the present invention is less costly and the performance of the trench IGBT manufactured by the manufacture method of the present invention is good.

BRIEF DESCRIPTION OF THE DRAWINGS

The above and other purposes as well as advantages of the present disclosure will become more apparent from the following specified description made with reference to the accompany drawings, where the same or familiar elements are represented the same reference numerals.

DETAILED DESCRIPTION OF THE EMBODIMENTS

Figure 1:
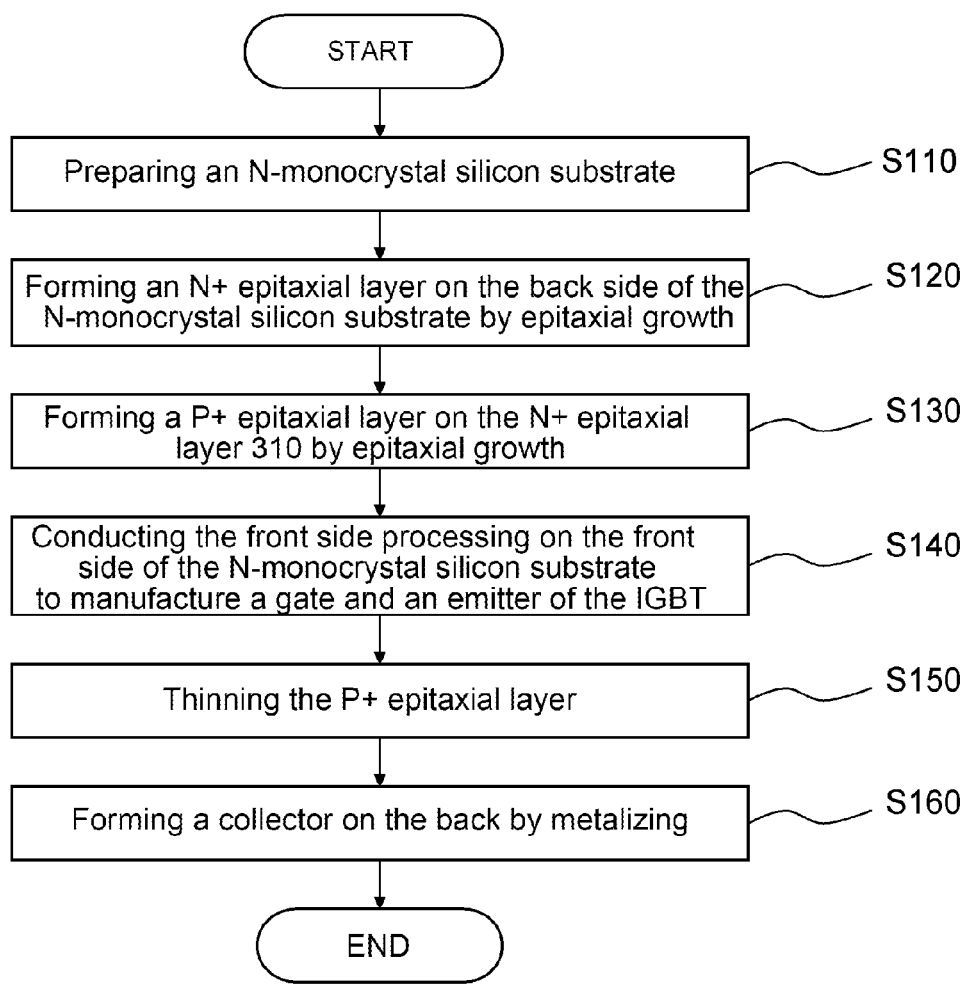
FIG. 1 is a flow chart of a manufacture method for a Trench IGBT according to an embodiment of the present invention.

Some of possible embodiments of the present invention, which will be introduced below, are intended to provide basic understanding of the present invention but not to define any key or decisive element of the present invention or to limit the scope of protection. It is readily understood that the skilled person in the art can propose other replaceable embodiments according to the technical solution of the present invention without departing from the essential spirit of the present invention. Therefore, the particular embodiments below and the drawings are simply the exemplary description of the technical solution of the present invention, and should not be considered as the whole of the present invention or the limitation or definition of the technical solution of the present invention.

In the drawings, for the sake of clearance, the thicknesses of layers and regions are exaggerated, and shape characters, such as rounded and smooth shape caused by etching, are not shown in the drawings.

Herein, orientation terms such as "front side", "back side", "above" and "below" are defined relative to a y-coordinate direction defined in the drawings. In the case of an IGBT device, the direction of an emitter or a gate of the IGBT device relative to the collector is defined as the positive direction of the y-coordinate axis, while the y-coordinate axis is perpendicular to a surface of the substrate used for manufacturing the IGBT device. Furthermore, it should be understood, these directivity terms are relative and used for relative description and clarification, and will change according to the changed orientation of the IGBT device. Additionally, the direction of a channel of the IGBT device within a cross-section of the IGBT device is defined as the x-coordinate direction, namely the horizontal direction.

A flow chart of a manufacture method for a Trench IGBT according to an embodiment of the present invention is shown in FIG. 1; and schematic views showing structure variations of the Trench IGBT being manufactured by the method shown in FIG. 1 are shown in FIGS. 2 to 7. The manufacture method in the embodiment will be described in detail with reference to FIGS. 1 to 7 below.

In Step S110, an N-monocrystal silicon substrate is prepared.

Figure 2:
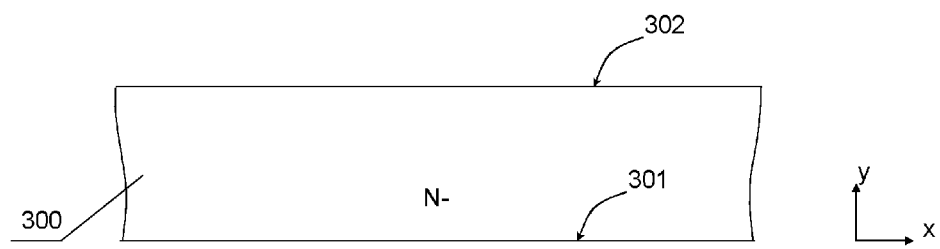
FIGS. 2 to 7 are schematic views showing structure variations of the Trench IGBT being manufactured by the method shown in FIG. 1.

As shown in FIG. 2, the crystal orientation of the N-monocrystal silicon substrate 300 is preferably <100>, and the doping concentration of the N-monocrystal silicon substrate is in a range from $1 \times 10^9$ ions/$cm^3$ to $1 \times 10^1$ ions/$cm^3$, for example is $6 \times 10^{14}$ ions/$cm^3$. The N-monocrystal silicon substrate 300 has a front side 302 and a back side 301, on which the front side processing and the back side processing for the trench IGBT are respectively conducted.

Further, in Step S120, an N+ epitaxial layer is formed on the back side of the N-monocrystal silicon substrate by epitaxial growth.

Figure 3:
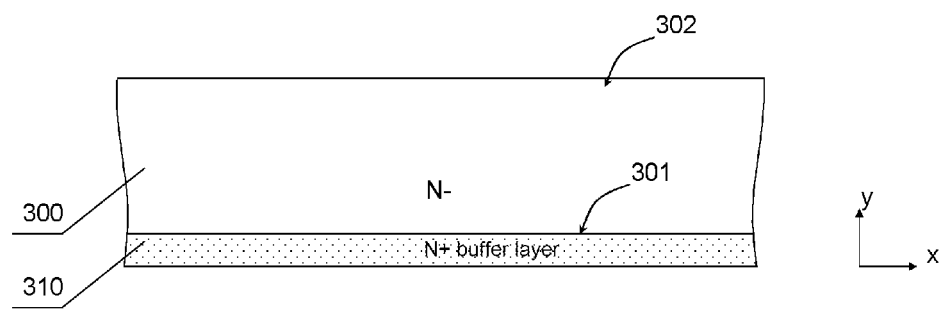

As illustrated in FIG. 3, an N+ epitaxial layer 310 is formed on the back side 301 of the N-monocrystal silicon substrate 300. Here, the N+ epitaxial layer 310 and the N-monocrystal silicon substrate 300 are of the same doping type, that is, the N+ epitaxial layer 310 is formed by the same-type epitaxial growth (with the same conductance type, namely the same doping type), so that the doping concentration of the N+ epitaxial layer 310 may be simply controlled compared to the reverse epitaxial growth. Preferably, the doping concentration of the N+ epitaxial layer 310 is within a range from $1 \times 10^{14}$ ions/$cm^3$ to $1 \times 10^{22}$ ions/$cm^3$ (for example, the doping concentration of the N+ epitaxial layer 310 is $5 \times 10^{18}$ ions/$cm^3$), the thickness of the N+ epitaxial layer 310 ranges from 0.0001 micrometers to 100 micrometers (for example, the thickness is 5 micrometers), and the temperature for the epitaxial growth in the epitaxial furnace in the process of the epitaxial growth of the N+ epitaxial layer 310 ranges from 1100° C. to 1240° C.

The N+ epitaxial layer 310 is eventually used to form a buffer layer of the Trench IGBT. Preferably, in Step S120, a step of single side polishing of the back side of the N-monocrystal silicon substrate 300 is conducted before the epitaxial growth, to ensure the proper epitaxial growth.

Furthermore, in Step S130, a P+ epitaxial layer is formed on the N+ epitaxial layer 310 by epitaxial growth.

Figure 4:
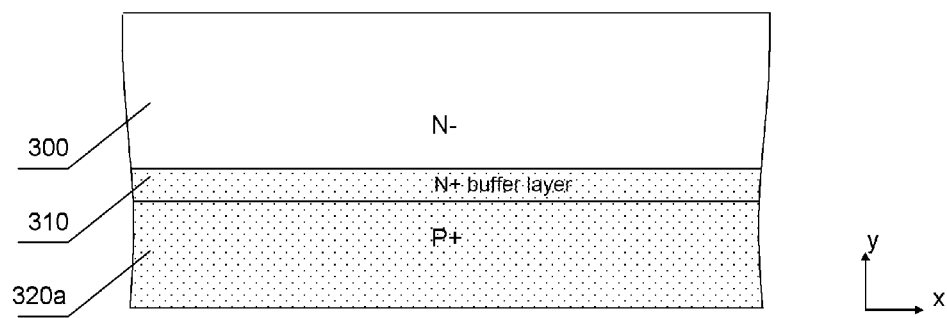

As illustrated in FIG. 4, the P+ epitaxial layer 320a is further formed on the N+ epitaxial layer 310 by reverse epitaxial growth. Preferably, the doping concentration of the P+ epitaxial layer 320a is within a range from $1 \times 10^{14}$ ions/$cm^3$ to $1 \times 10^{23}$ ions/$cm^3$ (for example, the doping concentration of the P+ epitaxial layer is $7 \times 10^{19}$ ions/$cm^3$), the thickness of the P+ epitaxial layer 320a is in the range from 1 micrometer to 600 micrometers (for example, the thickness is 20 micrometers), and in the epitaxial growth of the P+ epitaxial layer 320a, the temperature for the epitaxial growth in the epitaxial furnace is between 1100° C. to 1240° C.

Because the P+ epitaxial layer 320a is used to form the collector (referred to as C for short) eventually, the quality of the P+ epitaxial layer 320a (such as the number of defects) has a little effect on the performance of the Trench IGBT; further, most of the P+ epitaxial layer 320a will be removed for thinning in the following steps, therefore, the P+ epitaxial layer 320a formed in Step 130 by the epitaxial growth may have a lower quality than that of the epitaxial layer formed by the above second method in the prior art, thereby advantageously reducing the cost.

Furthermore, in Step S140, the front side processing is conducted on the front side of the N-monocrystal silicon substrate to manufacture a gate and an emitter of the IGBT.

Figure 5:
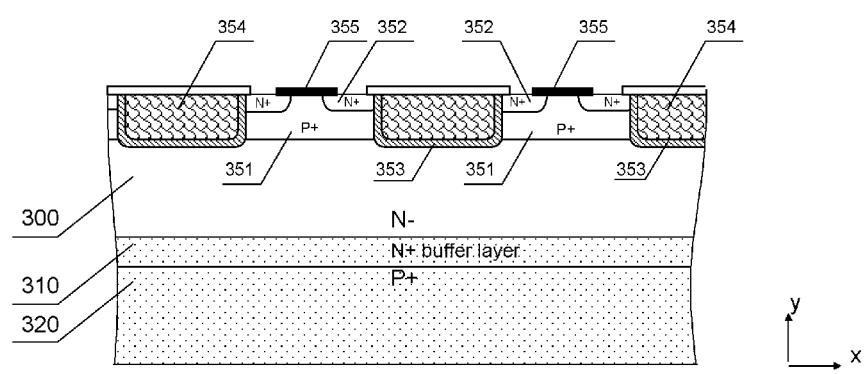

As illustrated in FIG. 5, an N-drift region of the Trench IGBT is formed in the N-monocrystal silicon substrate 300, a P+ body region 351 is formed on the front side of the N-monocrystal silicon substrate 300 by patterning and doping, a trench is formed in the P+ body region 351 by patterning and etching and a gate dielectric layer 352 is grown by oxidization in the trench, and a gate 354 made of polycrystalline silicon for example is formed in the trench; furthermore in the P+ body region 351, N+ emitter regions 352 are formed at both sides of the trench by patterning and doping. In this example, two N+ emitter regions 352 are both connected to an emitter 355, which is formed by a metallization process. In this example, the trench extends through the P+ body region 351 to the N-drift region, and the gate 354 is formed by the trench. Therefore, in the forming of the trench IGBT, the processes from forming the P+ body region 351 to forming the gate 354 and the emitter 355 on the front side of the N– monocrystal silicon substrate are collectively referred to as the front side processing, and the main body of the Trench IGBT is basically formed by this front side processing.

It shall be understood that the particular front side processing for the Trench IGBT or the particular structure formed by the front side processing are both not limited by the embodiments of the present invention as illustrated, instead, any front side processing and a structure formed thereby that are disclosed and revealed in the prior art may be adopted, even improved potential front side processing and a structure formed thereby may be adopted.

Further, in Step S150, the P+ epitaxial layer is thinned.

Figure 6:
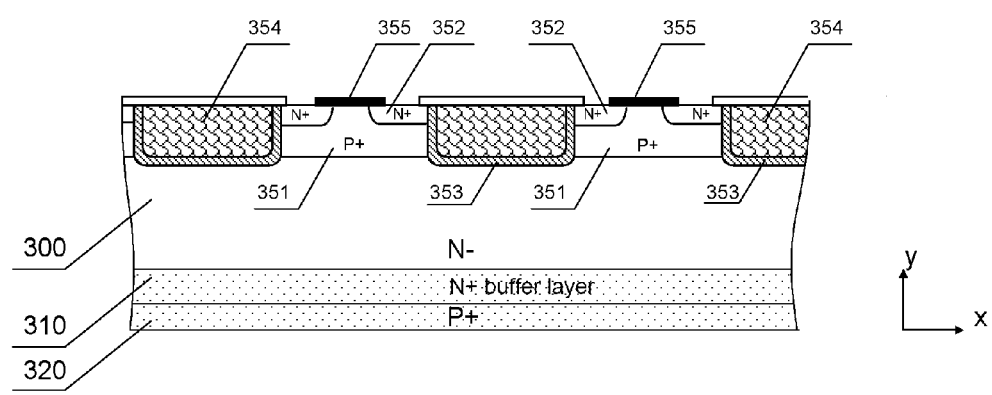

As illustrated in FIG. 6, the back side of the P+ epitaxial layer 320a is thinned by a thinning process such as a polishing process to form a P+ collector region 320. The doping concentration of the P+ collector region 320 is also within the range from $1 \times 10^{14}$ ions/cm$^3$ to $1 \times 10^{23}$ ions/cm$^3$ (for example, the doping concentration of the P+ collector region is $7 \times 10^{19}$ ions/cm$^3$), the thickness of the P+ collector region 320 ranges from 1 micrometer to 100 micrometers (for example, the thickness is 5 micrometers). Thus, the P+ epitaxial layer 320a is significantly thinned in this example.

Furthermore, in Step S160, a collector is formed on the back by metallization.

Figure 7:
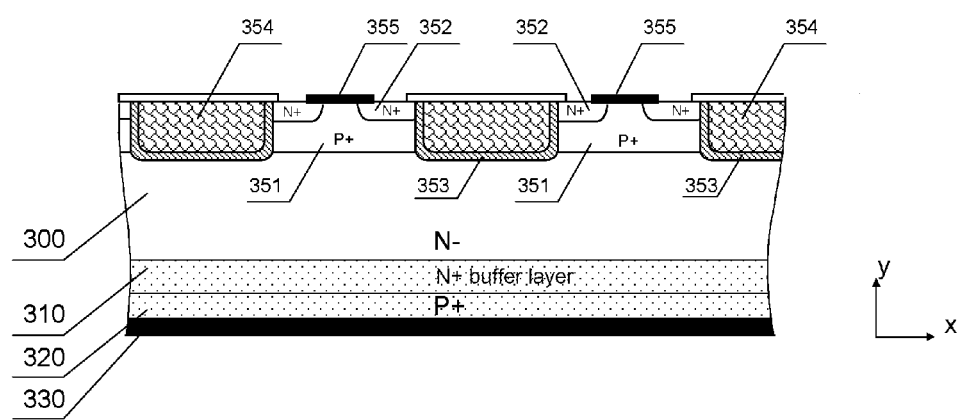

As illustrated in FIG. 7, a metal layer is deposited on the surface of the P+ collector region and metalized to form a collector 330. In a preferable example, the collector 300 has a composite stacked structure of Al/Ti/Ni/Ag, and Al, Ti, Ni, Ag are arranged in sequence from top to bottom (not shown); in another preferable example, the collector 300 has a composite stacked structure of Ti/Ni/Ag, and Ti, Ni, Ag are arranged in sequence from top to bottom (not shown); and in yet another preferable example, the collector 300 has a composite stacked structure of Al/Vanadium/Ti/Ag, and Al, Vanadium, Ni, Ag are arranged in sequence from top to bottom (not shown).

So far, the manufacture method of the embodiment as illustrated in FIG. 1 is basically finished, and the Trench IGBT as illustrated in FIG. 7 is formed. As shown in FIG. 7, it shall be noted that unit cells of a plurality of Trench IGBTs share a common collector 330 in parallel, resulting in relatively small resistance.

In the Trench IGBT of the embodiment as illustrated in FIG. 7, the N– buffer layer and the collector are formed by two epitaxial growth processes, respectively, which avoids a plurality of high-energy ion injection processes in the traditional technology, thus the present invention is low in costs and will not be limited by the high-energy ion injection device. Especially, the front side processing for the trench IGBT is performed with a semiconductor substrate such as a monocrystal silicon substrate, and hence the quality of the semiconductor substrate is better than the quality of a semiconductor layer formed by epitaxial growth, thereby significantly improving the performance (such as the saturation feature) of the Trench IGBT. Further, the semiconductor layer formed by epitaxial growth, which is mainly used to form a collector region, may have a low quality, so that the requirements for and costs of the epitaxial growth process are reduced.

The Trench IGBT of the embodiment as illustrated in FIG. 7 may be a Trench Field Stop IGBT, where the doping concentration of the N+ epitaxial layer 310 is higher than that of the N-Drift layer formed on the substrate, such that the strength of an electric field will be reduced to zero rapidly in the N+ epitaxial layer 310 according to the Poisson equation. It shall be understood that the manufacture method in the present invention can be also applied to the manufacture of a trench IGBT of other embodiments, such as a Non Field Stop IGBT without N+ epitaxial layer 310.

The examples explain the manufacture method for the Trench IGBT of the present invention and the trench IGBT formed by this method. Although just some of embodiments of the present are described, it should be understood by a skilled person in the art that the present invention can be implemented by various other embodiments without departing from the scope and the subject of the present invention. Therefore, the examples and embodiments as shown are considered to be exemplar and non-limiting, and various modifications and replacements are covered by the present invention without departing from the spirit and scope of the present invention defined by the appended claims.

The invention claimed is:

1. A manufacture method for a trench Insulated Gate Bipolar Transistor, comprising:
   preparing a semiconductor substrate;
   forming an epitaxial layer on a first side of the semiconductor substrate by epitaxial growth;
   forming a gate and an emitter of the trench Insulated Gate Bipolar Transistor on a second side of the semiconductor substrate;
   thinning the epitaxial layer to form a collector region; and
   metalizing in the collector region to form a collector;
   wherein the trench Insulated Gate Bipolar Transistor is a trench Field Stop Insulated Gate Bipolar Transistor; and
   the epitaxial growth comprises:
   forming a first epitaxial layer on the first side of the semiconductor substrate by epitaxial growth, wherein the first epitaxial layer is used to form a buffer layer; and
   forming a second epitaxial layer on the first epitaxial layer by epitaxial growth, wherein the second epitaxial layer is used to form a collector region.

2. The manufacture method according to claim 1, wherein thinning the epitaxial layer comprises thinning the second epitaxial layer.

3. The manufacture method according to 1, wherein the semiconductor substrate is N-type doped, the first epitaxial layer is N-type doped and the second epitaxial layer is P-type doped.

4. The manufacture method according to claim 3, wherein a doping concentration of the semiconductor substrate ranges from $1\times10^9$ ions/cm$^3$ to $1\times10^{15}$ ions/cm$^3$.

5. The manufacture method according to claim 4, wherein a doping concentration of the first epitaxial layer ranges from $1\times10^{14}$ ions/cm$^3$ to $1\times10^{22}$ ions/cm$^3$, and a thickness of the first epitaxial layer ranges from 0.0001 micrometers to 100 micrometers.

6. The manufacture method according to claim 3, wherein a doping concentration of the second epitaxial layer ranges from $1\times10^{14}$ ions/cm$^3$ to $1\times10^{23}$ ions/cm$^3$, and a thickness of the second epitaxial layer ranges from 1 micrometer to 600 micrometers.

7. The manufacture method according to claim 1, wherein temperature for the epitaxial growth ranges from 1100° C. to 1240° C.

8. The manufacture method according to claim 1, wherein the collector has a composite stacked structure of Al/Ti/Ni/Ag, or a composite stacked structure of Ti/Ni/Ag, or a composite stacked structure of Al/Vanadium/Ni/Ag.

9. The manufacture method according to claim 1, wherein before forming the epitaxial layer by epitaxial growth, the first side of the semiconductor substrate is polished.

\* \* \* \* \*